United States Patent [19]

Donoghue

[11] Patent Number: 4,670,675
[45] Date of Patent: Jun. 2, 1987

[54] HIGH GAIN SENSE AMPLIFIER FOR SMALL CURRENT DIFFERENTIAL

[75] Inventor: William J. Donoghue, Round Rock, Tex.

[73] Assignee: Advanced Micro Devices, Inc., Sunnyvale, Calif.

[21] Appl. No.: 827,836

[22] Filed: Feb. 7, 1986

[51] Int. Cl.[4] .......................... H03K 5/24; G11C 7/06
[52] U.S. Cl. ................................. 307/530; 365/189; 365/208; 307/362
[58] Field of Search .................. 307/530, 355, 362; 365/189, 190, 203, 205, 207, 208

[56] References Cited

U.S. PATENT DOCUMENTS

| | | | |
|---|---|---|---|
| 3,588,537 | 6/1971 | Brink | 307/530 X |
| 4,387,448 | 6/1983 | Takemae et al. | 307/530 X |
| 4,451,907 | 5/1984 | Donoghue et al. | 365/190 X |
| 4,467,456 | 8/1984 | Oritani | 365/190 |

OTHER PUBLICATIONS

"Multiplexed Sense Amplifier with Temporary Store for Noise Avoidance"; IBM-TDB; vol. 28, No. 2, pp. 643-644; 7/1985.

Primary Examiner—Larry N. Anagnos
Attorney, Agent, or Firm—Patrick T. King; Davis Chin

[57] ABSTRACT

A sense amplifier detecting a small current differential between a selected memory cell and a reference cell in a memory array includes a first pass transistor, a second pass transistor, a cross-coupled transistor arrangement and a differential amplifier. The cross-coupled transistor arrangement detect a small current differential between a bit sense current line and a bit sense reference current line. The difference current is amplified by the differential amplifier to produce an output data voltage indicative of the binary state of the selected memory cell.

17 Claims, 1 Drawing Figure

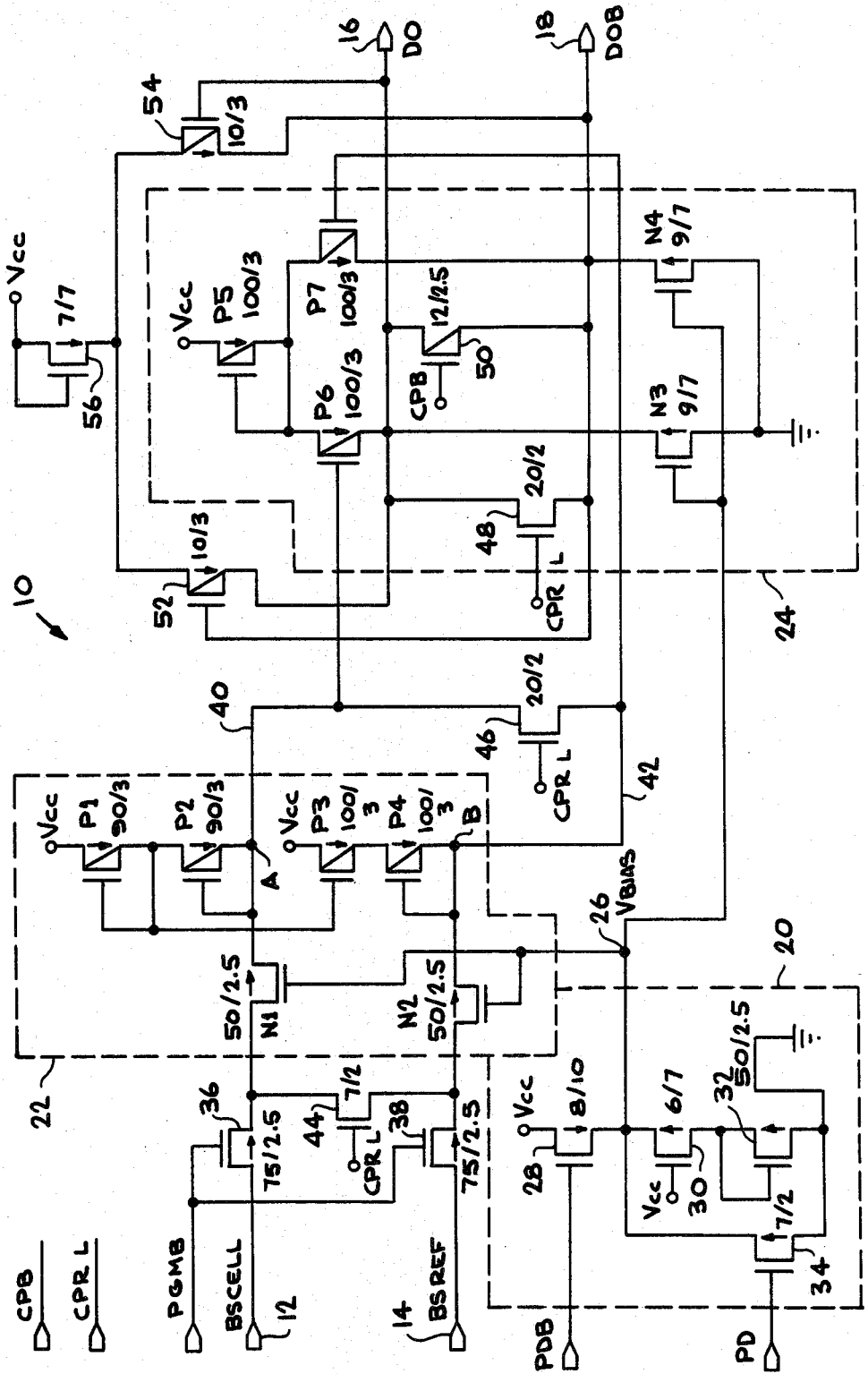

HIGH GAIN SENSE AMPLIFIER FOR SMALL CURRENT DIFFERENTIAL

BACKGROUND OF THE INVENTION

This invention relates generally to sense amplifiers and more particularly, it relates to a sense amplifier for detecting a small current differential from a semiconductor memory cell array.

Sense amplifiers are generally well known in the prior art and are typically used in electronic circuits to read data out of a semiconductor memory such as an EPROM or EEPROM cell array, a SRAM and the like. These prior art sense amplifiers are used to detect voltage differentials on bit lines which have had a memory array connected thereto. The voltage changes on the bit lines caused by the connection of a memory array thereto are very small and the sensing of such small voltage changes has created a difficult task for memory circuit designers. In addition, unless high tolerances are maintained during the fabrication of the integrated circuit there may be caused unbalanced bit lines which could interfere with the reading of data from a memory array. In order to overcome these problems, it has been provided heretofore the use of a dummy cell array with its own sense amplifier for each of the bit lines. However, the use of a dummy cell array and its associated circuitry tend to increase the size and complexity of the integrated circuit.

In view of this situation, there has arisen the need of a sense amplifier for detecting a small current differential between a selected memory cell and a reference cell in a semiconductor array without requiring a separate sense amplifier for the dummy cell array. In the present invention, the sense amplifier relies upon the use of a FET current mirror arrangement which has inherent design characteristics in integrated circuits. It is commonly known that FET devices which are dimensionally similar, positioned close in proximity to each other on a semiconductor chip, and subjected to a common fabrication process would generally have very similar functional characteristics. This allows the memory circuit designers to avoid the critical dimensional and process tolerances associated with fabricating integrating circuit devices used to detect small voltage differentials.

SUMMARY OF THE INVENTION

Accordingly, it is a general object of the present invention to provide a high gain sense amplifier for detecting a small current differential which is relatively simple and economical to manufacture and assemble, but yet overcomes the disadvantages of the prior art sense amplifiers.

It is an object of the present invention to provide a high gain sense amplifier for detecting a small current differential between a selected memory cell and a reference cell in a semiconductor memory cell array.

It is another object of the present invention to provide a high gain sense amplifier for detecting a small current differential which includes a reference voltage generator, a current-sensing circuit portion formed of a current mirror arrangement, and a differential amplifier for amplifying a current differential to indicate the binary state of a selected memory cell.

In accordance with these aims and objectives, the present invention is concerned with the provision of a high gain sense amplifier for detecting a small circuit differential between a selected memory cell and a reference cell in a memory array which includes a first pass transistor, a second pass transistor, a cross-coupled transistor arrangement, and a differential amplifier. The first pass transistor has one of its main electrodes coupled to an enabled bit sense line which is connectable to the selected memory cell of the memory array. The other main electrode of the first pass transistor is connected to a bit sense current line. A second pass transistor has one of its main electrodes coupled to a bit sense reference line which is connectable to a reference cell of the memory array. The other main terminal of the second pass transistor is connected to a bit sense reference current line. The transistor arrangement is formed of a first pair of P-channel MOS transistors serving as a load for the memory cell and is formed of a second pair of P-channel MOS transistors serving as a load for the reference cell. The differential amplifier is formed of a pair of input P-channel MOS transistors. The differential amplifier has a first input connected to the bit sense current line and has a second input connected to the bit sense reference current line so as to amplify a small current differential therebetween to indicate the binary state of the selected memory cell.

BRIEF DESCRIPTION OF THE DRAWINGS

These and other objects and advantages of the present invention will become more fully apparent from the following detailed description when read in conjunction with the accompanying drawing in which there is shown a schematic circuit diagram of the high gain sense amplifier for carrying out the current sensing technique of the instant invention.

DESCRIPTION OF THE PREFERRED EMBODIMENTS

Referring now in detail to the drawing of the particular illustration, there is shown a schematic circuit diagram of a high gain sense amplifier 10 of the present invention for detecting a small current differential between a selected memory cell and a reference cell in a memory cell array (not shown). The sense amplifier 10 has a first input terminal 12 connectable to an enabled bit sense line of the memory cell array and a second input terminal 14 connectable to a reference bit sense line of the array. The sense amplifier 10 has a first or true data output terminal 16 for indicating whether a high voltage state (binary one) or a low voltage state (binary zero) is stored in the selected memory cell of the array. The sense amplifier has also a second or complementary data output terminal 18 which has a voltage state that is the inverse of the true data output terminal 16. The sense amplifier functions during read memory operations to sense or detect the presence or absence of current flow through the selected memory cell connected to the enabled bit sense line, thereby determining the binary state of the selected memory cell.

The sense amplifier 10 comprises a reference voltage generator 20, a current-sensing circuit portion 22, and a differential amplifier circuit portion 24. The reference voltage generator 20 is provided to supply a reference bias voltage $V_{BIAS}$ at a voltage node 26 for the sense amplifier 10. The reference generator 20 is formed of three N-channel MOS transistors 28, 30 and 32. The transistor 28 has its drain electrode connected to a supply voltage or potential VCC which is typically +5.0 volts. The gate electrode of the transistor 28 is connected to a power-down voltage $\overline{PD}$ which is normally at +5.0 volts. The source electrode of the transistor 28 is connected to the drain of the transistor 30 and to the voltage node 26. The gate electrode of the transistor 30 is connected to the supply potential VCC, and the source of the transistor 30 is connected to the drain and gate electrodes of the transistor 32. The source electrode of the transistor 32 is connected to a ground potential. By way of illustration, where the supply potential VCC is +5.0 volts, the bias voltage $V_{BIAS}$ will be approximately 2 volts.

If desired, a power-drain transistor 34 may be connected between the voltage node 26 and the ground potential. The power-down transistor has its drain electrode connected to the voltage node 26 and has its source electrode connected to the ground potential. The gate electrode of the transistor 34 is connected to a power-down voltage PD. During a power-down or non-use condition the voltage $\overline{PD}$ will be at 0 volts and the voltage PD will be at +5 volts. As a result, the transistor 28 wil be turned off and the transistor 34 will be turned on so as to reduce the reference bias voltage at the node 26. In this manner, power can be conserved when the sense amplifier 10 is not in use. Of course, where the voltage $\overline{PD}$ is at +5.0 volts and the voltage PD is at 0 volts, indicating a power-up or use condition, the transistor 34 will be turned off and the transistor 28 will be turned on so that the reference bias voltage will be available in preparation for sense amplifier operation.

The current-sensing circuit portion 22 includes a pair of N-channel MOS pass transistors N1 and N2 and a pair of N-channel MOS program transistors 36 and 38. The first pass transistor N1 has one of its main electrodes such as the source coupled to the enabled bit sense line of the memory cell array via the channel of the program transistor 36. The other main electrode or drain of the first pass transistor N1 is connected to a line 40 which is defined as a bit sense current line. The second pass transistor N2 has it source electrode coupled to the reference bit sense line via the channel of the program transistor 38. The drain of the second pass transistor N2 is connected to a line 42 which is defined as a bit sense reference current line. The gate electrodes of the first and second pass transistors N1 and N2 are joined to the bias voltage $V_{BIAS}$ at the node 26. The pass transistors N1 and N2 serve to limit the voltage swing at the respective input terminals 12 and 14 to one threshold voltage drop $V_{TN}$ of the N-channel transistor below the bias voltage or $V_{BIAS} - V_{TN}$. The gate electrodes of the program transistors 36 and 38 are connected to a program voltage PG which is in a high logic state during the memory read operations. Thus, both of the program transistors 36 and 38 will be rendered conductive.

The current-sensing circuit portion 22 further includes a cross-coupled transistor arrangement formed of a first pair of P-channel MOS transistors P1, P2 and a second pair of P-channel MOS transistors P3 and P4. The first pair of transistors P1 and P2 serve as a load for the selected memory cell connected to the enabled bit sense line at the input terminal 12. The source of the transistor P1 is connected to the supply potential VCC. The gate and drain electrodes of the transistor P1 are connected to the source of the transistor P2 and to the gate of the transistor P3. The gate and drain electrodes of the transistor P2 are connected to the bit sense current line 40 at a node A and to the a first input of the differential amplifier circuit portion 24. The second pair of transistors P3 and P4 serve as a load for the reference cell connected to the reference bit sense line at the second input terminal 14. The source of the transistor P3 is also connected to the supply potential VCC. The gate of the transistor P3 is connected to the common gate and drain electrodes of the transistor P1. The drain of the transistor P3 is connected to the source of the transistor P4. The gate and drain electrodes of the transistor P4 are connected to the bit sense reference current line 42 at a node B and to a second input of the differential amplifier circuit section 24.

The differential amplifier circuit section 24 includes a first input P-channel MOS transistor P6, a second input P-channel MOS transistor P7, a current source, a first load resistor, and a second load resistor. The current source is formed of a P-channel MOS transistor P5. The first load resistor is formed of an N-channel MOS transistor N3, and the second load resistor is formed of an N-channel MOS transistor N4. The first input transistor P6 has its source connected to the source of the second input transistor P7. The common sources of the transistors P6 and P7 are connected to the gate and drain electrodes of the current source transistor P5. The source of the current source transistor P5 is connected to the supply potential VCC. The gate of the first input transistor P6 defining the first input of the differential amplifier is connected to the bit sense current line 40. The drain electrode of the transistor P6 is connected to the drain of the first load transistor N3 and to the true data output terminal 16. The gate of the second input transistor P7 defining the second input of the differential amplifier is connected to the bit sense reference line 42. The drain of the transistor P7 is connected to the drain of the second load transistor N4 and to the complementary data output terminal 18. The gate electrodes of the load transistors N3 and N4 are connected together and to the bias voltage $V_{BIAS}$ at the node 26. The sources of the transistors N3 and N4 are also connected together and to the ground potential.

The transistors P1 and P2 function as a current mirror in conjunction with the transistors P6 and P5. Further, the transistors P3 and P4 function as a current mirror in conjunction with the transistors P7 and P5. During the memory read operations, if the selected memory cell is conductive, i.e., a binary one is stored, the first input terminal 12 will be pulled to a low potential which will cause the first pass transistor N1 to be turned on. This will, in turn, cause the load transistors P1 and P2 for the memory cell to be rendered conductive. Since the gates of the transistors P3 and P4 are crossed-coupled to the transistor P1, these transistors will likewise be rendered conductive. In actual practice, the width-to-length channel of the transistors P1 and P2 are somewhat smaller than the width-to-length channel ratio of the transistors P3 and P4. Therefore, the voltage at the node A will be less than the voltage at the node B. Consequently, a small current differential will appear therebetween causing the first input transistor P6 to turn on and the second input transistor P7 to turn off. With the transistor P6 being turned on, the load current will pass through the first load resistor N3 to provide a high potential at the true data output terminal 16 indicating that a binary one had been stored.

On the other hand, if the selected memory cell is not conductive, i.e., a binary zero is stored, the first input terminal 12 will have a high potential so as to turn off the first pass transistor N1 and thus no current will flow through the load transistors P1 and P2. Therefore, the voltage at the node B will be lower than the node A so as to cause the second input transistor P7 to be turned on and the first input transistor P6 to be turned off. Consequently, the load current will flow through the second load transistor N4. Accordingly, the complementary data output terminal 18 will have a high potential indicating that a binary zero had been stored.

The difference between the voltages at the node A and the node B is sufficient to provide an indication of current flowing through the selected memory cell connected to the enable bit sense line at the first input terminal 12. Thus, it is possible to ascertain the binary information stored in the selected memory cell by comparing the current flowing the selected memory cell against the current flowing in the reference cell. Since the current drawn through a conductive memory cell is relatively small, the differential amplifier is utilized to provide high gain amplification so as to generate a voltage differential at the true and complementary output terminal 16 and 18. The demensional differences between the load transistors (N3, N4) and the current source transistor (P5) are selected so as to bias the operating levels of the first and second input transistors P6 and P7 in their high gain regions. This technique is generally known to those skilled in the art.

In contrast to the prior art, the present current mirror arrangement for detecting the binary state of the selected memory cell does not compare voltage differentials on bit lines, but rather relies upon the small current differential between the bit sense current line and the bit sense reference current line. With the load transistors P1 and P2 being formed of structurally similar devices to that of load transistors P3 and P4, when they placed adjacent each other on a semiconductor chip, there will maintained substantially identical functional characteristics in spite of process variations.

Equallizing MOS transistors 44, 46, 48 and 50 are provided so as to be turned on for equallizing the voltages at the output terminals 16 and 18 prior to the next memory read operation. Further, there are provided N-channel MOS transistors 52 and 54 which are utilized to prevent the true date and the complementary data output voltage at the respective terminals 16 and 18 from dropping below a predetermined voltage level when they are in the high level state. An N-channel MOS transistor 56 is also provided which functions as a current source for the anti-drooping transistors 52 and 54.

From the foregoing detailed description it can thus be seen that the present invention provides a high gain sense amplifier for detecting a small current differential between a selected memory cell and a reference cell of a semiconductor memory cell array. The sense amplifier of the instant invention includes a reference voltage generator, a cross-coupled transistor arrangement and a differential amplifier.

While there has been illustrated and described what is at present to be considered a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the present invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A high gain sense amplifier for detecting a small current differential between a selected memory cell and a reference cell in a memory cell array comprising:

a first pass transistor having one of its main electrodes coupled to an enabled bit sense line which is connectable to the memory cell of the memory array, said first pass transistor having its other main electrode connected to a bit sense current line;

a second pass transistor having one of its main electrodes coupled to a bit sense reference line which is connectable to the reference cell of the memory array, said second pass transistor having its other main electrode connected to a bit sense reference current line;

a cross-coupled transistor arrangement formed of a first pair of P-channel MOS transistors functioning as a load for the memory cell and of a second pair of P-channel transistors functioning as a load for the reference cell;

said first pair of transistors consisting of first and second transistors, said first transistors having its source connected to a supply potential and having its gate and drain connected together and to the source of said second transistor, said second transistor having its gate and drain connected together and to the bit sense current line;

said second pair of transistors consisting of third and fourth transistors, said third transistor having its source connected to the supply potential, its gate connected to the source of said second transistor and its drain connected to the source of said fourth transistor, said fourth transistor having its gate and drain connected together and to the bit sense reference current line; and a differential amplifier formed of fifth and sixth P-channel MOS transistors, the sources of said fifth and sixth transistor being connected together and to the supply potential via a current source, said fifth transistor having its gate connected to the bit sense current line and its drain connected to a first load resistor and to a true data output terminal, said sixth transistor having its gate connected to the bit sense reference current line and it drain connected to a second load resistor and to a complementary data output terminal.

2. A sense amplifier as claimed in claim 1, wherein said current source comprises a P-channel MOS transistor, said current source transistor having its source connected to the supply potential and having its gate and drain connected to the common sources of the fifth and sixth transistors.

3. A sense amplifier as claimed in claim 1, wherein said first load resistor comprises a N-channel MOS transistor, said first load transistor having its drain connected to the drain of said fifth transistor, its gate connected to a reference bias voltage and its source connected to a ground potential.

4. A sense amplifier as claimed in claim 1, wherein said second load resistor comprises a N-channel MOS transistor, said second load transistor having its drain connected to the drain of said sixth transistor, its gate connected to a reference bias voltage and its source connected to a ground potential.

5. A sense amplifier as claimed in claim 1, further comprising a reference voltage generator for supplying a reference bias voltage which is connected to the gates of said first and second pass transistors.

6. A sense amplifier as claimed in claim 1, wherein said one of the main electrodes of said first pass transistor comprises a source and wherein the other main electrode of said first pass transistor comprises a drain.

7. A sense amplifier as claimed in claim 1, wherein said one of the main electrodes of said first pass transistor comprises a drain and wherein the other main electrode of said first pass transistor comprises a source.

8. A sense amplifier as claimed in claim 1, wherein said one of the main electrodes of said second pass transistor comprises a source and wherein the other main electrode of said second pass transistor comprises a drain.

9. A sense amplifier as claimed in claim 1, wherein said one of the main electrodes of said second pass transistor comprises a drain and wherein the other main electrode of said second pass transistor comprises a source.

10. A sense amplifier for detecting a small current differential between a selected memory cell and a reference cell in a memory array comprising:
   a first pass transistor having one of its main electrodes coupled to an enabled bit sense line which is connectable to the memory cell of the memory array, said first pass transistor having its other main electrode connected to a bit sense current line;
   a second pass transistor having one of its main electrodes coupled to a bit sense reference line which is connectable to the reference cell of the memory array, said second pass transistor having its other main electrode connected to a bit sense reference current line;
   cross-coupled transistor means for detecting a small current differential between the bit sense current line and the bit sense reference current line; and
   differential amplifier means having a first input responsive to the current flowing in the bit sense current line and having a second input responsive to the current flowing in the bit sense reference current line for amplifying the current difference therebetween to produce an output data voltage indicative of the binary state of the selected memory cell.

11. A sense amplifier as claimed in claim 10, further comprising a reference voltage generator for supplying a reference bias voltage which is connected to the gates of said first and second pass transistors.

12. A sense amplifier as claimed in claim 10, wherein said one of the main electrodes of said first pass transistor comprises a source and wherein the other main electrode of said first pass transistor comprises a drain.

13. A sense amplifier as claimed in claim 10, wherein said one of the main electrodes of said first pass transistor comprises a drain and wherein the other main electrode of said first pass transistor comprises a source.

14. A sense amplifier as claimed in claim 10, wherein said one of the main electrodes of said second pass transistor comprises a source and wherein the other main electrode of said second pass transistor comprises a drain.

15. A sense amplifier as claimed in claim 10, wherein said one of the main electrodes of said second pass transistor comprises a drain and wherein the other main electrode of said second pass transistor comprises a source.

16. A sense amplifier as claimed in claim 10, wherein said cross-coupled transistor means includes a first pair of P-channel MOS transistors functioning as a load for the memory cell and a second pair of P-channel MOS transistors functioning as a load for the reference cell.

17. A sense amplifier as claimed in claim 10, wherein said differential means includes a differential amplifier formed of a pair of input P-channel MOS transistors.

* * * * *